(12) United States Patent
Chou et al.

(10) Patent No.: US 8,603,386 B2
(45) Date of Patent: Dec. 10, 2013

(54) COMPOSITIONS AND PROCESSES FOR NANOIMPRINTING

(76) Inventors: Stephen Y. Chou, Princeton, NJ (US); Zengli Fu, Monmouth Junction, NJ (US); Lei Chen, Clarksburg, MD (US); Haixlong Ge, Naking (CN)

( * ) Notice: Subject to any disclaimer, the term of this patent is extended or adjusted under 35 U.S.C. 154(b) by 498 days.

(21) Appl. No.: 11/980,918

(22) Filed: Oct. 31, 2007

(65) Prior Publication Data

US 2008/0277826 A1 Nov. 13, 2008

Related U.S. Application Data

(63) Continuation-in-part of application No. 10/706,757, filed on Nov. 12, 2003, which is a continuation-in-part of application No. 10/301,475, filed on Nov. 21, 2002, now Pat. No. 6,828,244, which is a continuation of application No. 09/430,602, filed on Oct. 29, 1999, now Pat. No. 6,518,189, which is a continuation-in-part of application No. 09/107,006, filed on Jun. 30, 1998, now Pat. No. 6,309,580, which is a continuation of application No. 08/558,809, filed on Nov. 15, 1995, now Pat. No. 5,772,905.

(60) Provisional application No. 60/425,587, filed on Nov. 12, 2002.

(51) Int. Cl.
*B29C 35/08* (2006.01)

(52) U.S. Cl.
USPC .......... 264/496; 264/494; 264/220; 264/227; 264/293; 264/299; 264/319; 264/106; 264/107

(58) Field of Classification Search
USPC ......... 264/319, 494, 496, 220, 227, 293, 299, 264/106, 107; 216/52
See application file for complete search history.

(56) References Cited

U.S. PATENT DOCUMENTS

| | | | | |
|---|---|---|---|---|
| 3,345,434 A | * | 10/1967 | Griffith | 264/523 |
| 4,810,547 A | * | 3/1989 | Minami et al. | 264/106 |
| 5,224,090 A | * | 6/1993 | Umeda et al. | 369/284 |
| 5,259,926 A | * | 11/1993 | Kuwabara et al. | 216/54 |
| 5,620,819 A | * | 4/1997 | Conforti et al. | 430/14 |
| 5,981,616 A | * | 11/1999 | Yamamura et al. | 522/168 |
| 2002/0102490 A1 | * | 8/2002 | Ito et al. | 430/270.1 |
| 2002/0190415 A1 | * | 12/2002 | Yang et al. | 264/42 |

OTHER PUBLICATIONS

Flanders, Replication of 175 angstrom lines and spces in polymethylmethacrylate using xray lithography, 1980, Applied Physics Letters, 36, 93, pp. 93-96.*

Harmening et al, Molding of Threedimensional Microstructures by the LIGA Process, 1992, IEEE, Micro Electro Mechanical Systems 1992, Travemunde, Germany, pp. 202-207.*

Ehrfeld et al, Materials for LIGA Products, 1994, Proceedings IEEE Micro Electro Mechanical Systems, pp. 86-90.*

* cited by examiner

*Primary Examiner* — Timothy Kennedy
(74) *Attorney, Agent, or Firm* — Polster, Lieder, Woodruff & Lucchesi, LC

(57) ABSTRACT

The invention is directed to new nanoimprint resist and thin-film compositions for use in nanoimprinting lithography. The compositions permit economical high-throughput mass production, using nanoimprint processes, of patterns having sub-200 nm, and even sub-50 nm features.

19 Claims, No Drawings

COMPOSITIONS AND PROCESSES FOR NANOIMPRINTING

CROSS-REFERENCE TO RELATED APPLICATIONS

This application is a continuation-in part of U.S. Ser. No. 10/706,757, filed Nov. 12, 2003; which is a continuation-in part of U.S. Ser. No. 10/301,475, filed on Nov. 21, 2002 now U.S. Pat. No. 6,828,244 which is a continuation of U.S. Ser. No. 09/430,602, filed Oct. 29, 1999, now U.S. Pat. No. 6,518,189; which is a continuation-in-part of U.S. Ser. No. 09/107,006, filed Jun. 30, 1998, now U.S. Pat. No. 6,309,580; which is a continuation-in-part of U.S. Ser. No. 08/558,809, filed Nov. 15, 1995, now U.S. Pat. No. 5,772,905; each of which patents and patent applications are hereby incorporated herein by reference in their entirety. This application also claims benefit of U.S. Provisional Application Ser. No. 60/425,587, filed Nov. 12, 2002, incorporated by reference herein in its entirety.

FIELD THE INVENTION

The invention relates to compositions for use in nanoimprinting processes and nanoimprinting apparatus. The invention also relates to processes of using moldable compositions that create patterns with ultra fine features in thin films carried on substrate surfaces.

BACKGROUND OF THE INVENTION

Lithography, particularly photolithography, is used to fabricate semiconductor-integrated electrical circuits; integrated optical, magnetic, mechanical circuits; and microdevices. Lithographic pattern formation involves chemically treating specific regions of a thin film carried on a substrate then removing either the treated or untreated regions as appropriate, for example, by dissolving in a processing solvent. In subsequent steps, the pattern is replicated in the substrate or in another material. In combination with traditional resist imaging, lithography can be used to manufacture printing plates and resist images. The thin film, which accepts a pattern or image during the lithographic process, is often referred to as resist. The resist may be either a positive resist or a negative resist. A positive photoresist becomes more soluble in the processing solvent where irradiated, while a negative resist becomes insoluble where irradiated. A typical lithographic process for integrated circuit fabrication involves exposing or irradiating a photoresist composition or film with a radiation or particle beam, such as light, energetic particles (e.g., electrons), photons, or ions by either passing a flood beam through a mask or scanning a focused beam. The radiation or particle beam changes the chemical structure of the exposed area of the film, so that when washed or immersed in a processing solvent, either the exposed or the unexposed areas of the resist dissolve. Lithographic resolution is limited by the wavelength of the particles, the resolution of the beam, the particle scattering in the resist and the substrate, and the properties of the resist. There is an ongoing need in art of lithography to produce smaller pattern sizes while maintaining cost efficiency. Particularly, there is a great need to develop low-cost technologies for mass-producing sub-50 nm structures. As used herein, the term "sub-xx nm features", wherein xx is a number, generally refers to a plurality of structures having at least one dimension less than xx nm. As used herein, the term "sub-xx nm features", wherein xx is a number, refers generally to a plurality of structures having at least one dimension less than xx nm. Such developments will have an enormous impact in many areas of engineering and science.

Numerous technologies have been developed to service these needs, but they all suffer drawbacks and cannot be used to mass produce sub-50 nm lithography at a low cost. Electron beam lithography has demonstrated 10 nm lithography resolutions. A. N. Broers, J. M. Harper, and W. W. Molzen, APPL. PHYS. LETT. 33, 392 (1978) and P. B. Fischer and S. Y. Chou, APPL. PHYS. LETT. 62, 2989 (1993). But using this technology to mass produce sub-50 nm structures is economically impractical due to inherent low throughput. X-ray lithography, which can have a high throughput, has demonstrated 50 nm lithography resolution. K. Early, M. L. Schattenburg, and H. I. Smith, MICROELECTRONIC ENGINEERING 11, 317 (1990). But X-ray lithography devices are expensive. X-ray lithography has not been used to commercially mass produce sub-50 nm structures. Lithography based on scanning probes has produced sub-10 nm structures in a very thin layer of materials. But, the practicality of such lithography as a manufacturing tool is not apparent.

Another nanostructure manufacturing process is refereed to in the art as nanoimprinting or nanoimprint lithography, which involves compressive patterning of deformable films coated on a substrate by way of a mold having protrusions and recesses. See for example, U.S. Pat. Nos. 5,772,905 and 6,309,580. The thickness of the film under the protruding feature is thinner than the thickness of the film under the recess. Thus, a relief is formed in the thin film. The relief conforms the mold's features. The relief is processed such that the thinner portion of the film is removed thereby exposing the underlying substrate in a pattern complementary to the mold. The relief patterns so produced can be reproduced in the substrate or in another material.

The patterns formed in nanoimprint lithography are defined by the mold instead of any radiation exposure. Nanoimprint lithography can eliminate many resolution limitations imposed in conventional lithography, such as wavelength limitation, backscattering of particles in the resist and substrate, and optical interference.

This low-cost mass manufacturing technology and has been around for several decades. Using nanoimprint technology, features on the order of 1 micrometer have been routinely imprinted in plastics. Compact disks, which are based on imprinting of polycarbonate, are one example of the commercial use of this technology. Other examples are imprinted polymethylmethacrylate (PMMA) structures with a feature size on the order to 10 micrometers for making micromechanical parts. M. Harmening et al., PROCEEDINGS IEEE MICRO ELECTRO MECHANICAL SYSTEMS, 202 (1992). Molded polyester micromechanical parts with feature dimensions of several tens of microns have also been used. H. Li and S. D. Senturia, PROCEEDINGS OF 1992 13TH IEEE/CHMT INTERNATIONAL ELECTRONIC MANUFACTURING TECHNOLOGY SYMPOSIUM, 145 (1992). But imprint technology has not been able to provide 25 nm structures with high aspect ratios.

Because nanoimprint lithography is based on the deformation of the polymer resists by a mold instead of changing the solvent-dissolution properties of the resists in photolithography (E. Reichmanis and L. F. Thompson, CHEM. REV. 89, 1273-1289 (1989)), it is necessary to develop the specific polymer resist compositions that can be easily deformed with good viscose flow ability by mold on a substrate and can survive on the substrate after mold separation. Disadvantageously, the thin-film compositions used in standard nanoimprinting processes have physical properties that cause deformities that decrease resolution. Stress is caused when higher temperatures are used to increase the polymeric film's flowability so that it can flow into the nanomold. As used herein, the term "nanomold" generally refers to a mold having a plurality of structures having at least one dimension less than 200 nm. On the other hand, if the temperature used during heated-imprinting is not too high and the resist material is then cooled and solidified after conformal deformation against the mold, or if other physical or chemical conditions are applied after conformal imprinting of a liquid resist material at room temperature and the material is solidified, then the resist material does accurately conform to the small features of the mold because of the decreased or totally loss of the flowability.

The requirements for nanoimprint lithography materials ("nanoimprint resists") are quite different than polymeric materials that are typically used in traditional plastics molding techniques, such as injection molding or liquid casting. For example, nanoimprint resists typically require the ability to be processed into uniform thin-films on substrates. In addition, the rheology (i.e., flow characteristics) of polymeric materials deposited as thin polymeric films or discrete liquid drops on surfaces is oftentimes quite different that the rheology of bulk polymeric materials or liquids.

U.S. Pat. No. 5,772,905 discloses the use of polymethylmethacrylate ("PMMA") as a nanoimprint resist, which is advantageously spin castable on a silicon wafer, has good mold release properties and has low thermal shrinkage. The disclosed nanoimprint process requires heating of the spin coated PMMA nanoimprint resist to temperatures (ca. 200° C.) substantially higher than the glass transition temperature ("$T_g$") of PMMA (ca. 105° C.) to soften the resist to enable nanoimprinting. The nanoimprint mold is removed after cooling the nanoimprint resist below $T_g$. This heating and cooling disadvantageously requires process time and can lead to alignment and registration problems of the process equipment arising from thermal expansion and contraction. The need therefore exists to develop nanoimprint resists that overcome these problems.

U.S. Pat. No. 6,309,580 the discloses nanoimprint lithography wherein the mold is pre-treated with a release material that facilitate mold removal and thereby enhance image resolution. Use of the release material also protects the mold so that it can be used repeatedly without showing wear of its fine features. After the relief is processed, the exposed portions of the substrate's surface have sub-200 nm features. Because mold pretreatment is an additional step that is preferably eliminated from the nanoimprint lithography process to increase manufacturing throughput, the need therefore exists to develop nanoimprint resists that provide enhanced image resolution without the need to pretreat the nanomolds.

Accordingly, there is a continuing need for additional improvements in processes, apparatus, materials, and protocols for use in nanoimprint lithography. For example, there is need for new thin-film compositions for use in nanoimprint technology that overcome the above-mentioned problems. Thus, there is a need to provide nanoimprint resists that do not require extensive heating and cooling and which release well from untreated molds.

Mostly, the ultimate goal of the lithography process is to make 3D shapes out of certain functional materials. In today's art, almost all the lithography methods (photolithography, electron-beam lithography, including nanoimprint lithography) are used to first define the micro- or nano-patterns on top of a functional material. To finally achieve 3D shapes of the functional material, subsequent steps (often being multiple steps) are needed to remove and shape the materials. This is obviously a costly process. Imprinting provides the advantage of directly shaping a material into 3D structures; and many functional materials used in micro- and nano-devices are inherently moldable or can be redesigned and formulated to be moldable. These type of materials include, but not limited to, dielectric materials, conductive polymers, organic LED materials, optical media, photoactive materials, and chemically active materials. Therefore, nanoimprint process can be used to make functional material structures in an essentially one-step process, greatly saving manufacturing cost of these types of devices. Accordingly, new imprintable functional material compositions are needed.

SUMMARY OF THE INVENTION

In overcoming the problems associated with nanoimprint resists that do not require extensive heating and cooling and which release well from untreated molds, the invention provides, inter alia, methods for forming patterns in a film carried on a substrate. In various aspects of the invention, there are provided methods of:

obtaining a mold of a material, which mold is hard relative to the film, the film including a polymeric composition deformable by said mold at a temperature of less than 200° C.;

the mold having first and second protruding features spaced apart from each other and a recess formed thereby, the first and second features and the recess having a shape forming a mold pattern and providing at least one mold pattern lateral dimension which is less than 200 nm;

urging the mold into the nanoimprint material under a molding pressure;

the thickness of the nanoimprint material under the protruding features of the mold being formed at the minimum level, and the thickness of the nanoimprint resist material under the recessing features of the mold being formed at the maximum level, thereby forming the molded pattern in the nanoimprint material;

removing the mold from the nanoimprint material; and removing the nanoimprint material in the patterns where it has the minimum thickness, thereby exposing portions of the surface of the substrate which underlie the thin region such that the exposed portions of the surface of the substrate substantially replicate the mold pattern and have at least one lateral dimension which is less than 200 nm.

In further aspects, there are provided methods of forming a plurality of structures having at least one dimension less than 200 nm, which includes the step of imprinting a nanoimprint resist using a mold, said nanoimprint resist having a polymeric composition deformable by said mold at a temperature of less than 200° C. In this aspect of the invention, the polymeric composition is capable of retaining the plurality of structures upon removal of said mold.

Within additional aspects, there are provided thin films having a nanoimprint resist including a polymeric composition deformable by a mold at a temperature of less than 200° C., the mold being capable of forming a plurality of structures having at least one dimension less than 200 nm. In this aspect of the invention, the polymeric composition is capable of retaining said plurality of structures upon removal of said mold.

In yet other aspects, there are provided nanoimprint resists including a polymeric composition deformable by a mold at a temperature of less than 200° C., the mold being capable of forming a plurality of structures having at least one dimension less than 200 nm. In this aspect of the invention, the polymeric composition is capable of retaining said plurality of structures upon removal of said mold.

In yet other aspects, there are provided nanoimprint resists including a polymeric composition deformable by a mold at a temperature of less than 200° C., the mold being capable of forming a plurality of structures having at least one dimension less than 200 nm. In this aspect of the invention, the polymeric composition is capable of retaining said plurality of structures upon removal of said mold.

In various aspects, new nanoimprint resist compositions are provided for use in nanoimprinting lithography. The compositions permit economical high-throughput mass production, using nanoimprint processes, of patterns having sub-50 nm features. Various compositions are selected from: (a) thermoplastic materials that are sufficiently soft at ambient conditions, or which can soften sufficiently upon additional heating to flow into the nanomold features (that thermoplastic polymer may be further polymerizable, crosslinkable, graftlinkable, or a combination thereof); and (b) liquid or flowable compositions (e.g., polymers, oligomers, monomers, cross-linking agents, lubricants and plasticizers) that can flow into the features of a nanomold, and which can be subsequently hardened using chemical means (e.g., cross-linking, polymerization, or both) or using thermophysical means (e.g., cooling through a first order transition such as known in block copolymers, or crystallization, or both; or cooling through a second order transition, such as the glass transition); or a combination of both chemical and thermophysical means.

In various aspects, the compositions are provided as single or multiple layer structures, or as discrete liquid droplets on a substrate. In this embodiment, a pattern can be imprinted in the top layer and then is transferred to the lower layer by etching or other methods.

In certain aspects, there are provided compositions that permit a high throughput mass production method for generating patterns having sub-25 nm features, which is unattainable with methods described in the prior art. The flowability and stability of a variety of compositions in molds having different feature size patterns provided by these aspects of the invention is particularly noteworthy. Accordingly, in contrast to conventional lithography, nanoimprint lithography processes involve low temperatures. Because in nanoimprint processes, the resist compositions desirably flow into the mold, they desirably have good low-temperature flowability. The excellent flowability of compositions at low temperature is much improved over prior-art thin film or liquid compositions.

In further aspects, the compositions provide highly uniform thin films on substrates. Such high uniformity greatly improves nanoimprint processes. The compositions further improve nanoimprinting processes because they exhibit good adhesion to the substrate while, at the same time, exhibit good release properties from the mold.

In further aspects, the compositions provide imprintable functional materials including, but not limited to, dielectric materials, conductive polymers, organic LED materials, optical media, photoactive materials, and chemically active materials.

DETAILED DESCRIPTION OF THE INVENTION

The term "polymer" used herein denotes a molecule having two or more units derived from the same monomer component, so that "polymer" incorporates molecules derived from different monomer components to for form copolymers, terpolymers, multi-component polymers, graft-co-polymers, block-co-polymers, and the like. These polymers can bear at least one reactive group and thus called "reactive polymers."

The term "glassy" used herein denotes the thermodynamic state of a polymer below its glass transition temperature. The term "units derived from" used herein refers to polymer molecules that are synthesized according to known polymerization techniques wherein a polymer contains "units derived from" its constituent monomers. The term "molecular weight" used herein refers to the weight average molecular weight of polymer molecules as determined by the gel permeation chromatography method. The term "graftlinker" used herein refers to multi-functional monomers capable of forming multiple covalent bonds between polymer molecules of one type with polymer molecules of another type. The term "crosslinker" used herein refers to multi-functional monomers capable of forming two or more covalent bonds between polymer molecules of the same type. The term "alkyl (meth) acrylate" used herein refers to both alkyl acrylate and alkyl methacrylate monomer compounds. The term "parts" used herein is intended to mean "parts by weight". Unless otherwise stated, "total parts by weight" do not necessarily add to 100. The term "weight percent" used herein is intended to mean "parts per hundred by weight" wherein the total parts add to 100. All ranges described herein are inclusive and combinable. As used herein, the term "micro-replication" refers to relief surface patterns capable of transferring features greater than about 200 nm. As used herein, the term "nano-replication" refers to relief surface patterns capable of transferring features smaller than about 200 nm.

The methods of the invention for forming a pattern having features small than 200 nanometers in a film or discrete liquid droplets carried on a substrate typically involve a variety of steps which include obtaining a mold of a material, which mold is hard relative to the nanoimprint material, the nanoimprint material including a polymeric composition deformable by said mold at a temperature of less than 200° C. In these methods, the mold typically has first and second protruding features spaced apart from each other and a recess formed thereby. The first and second features and the recess typically have a shape that is capable of forming a mold pattern and providing at least one mold pattern lateral dimension which is less than 200 nm. In these methods, the mold is urged into the nanoimprint resist material under a molding pressure, thereby forming a minimum thickness of the material under the protruding features of the mold, which forms the mold pattern in the film. Further steps of solidifying the material, removing the mold from the imprinted resist material; and removing the imprinted material from the pattern areas of minimum material thickness, exposes portions of the surface of the substrate which underlie the thin region such that the exposed portions of the surface of the substrate substantially replicate the mold pattern and have at least one lateral dimension which is less than 200 nm. Additional details pertaining to nanoimprint lithography processes are provided in U.S. Pat. Nos. 5,772,905; 6,309,580; 6,482,742; 6,518,189; U.S. Pat. App. Pub Nos. 2002/0132482A1; 2002/0167117A1; 2003/0034329A1; 2003/0080471A1; 2003/0080472A1; 2003/0170995A1; 2003/0170996A1; and Int. App. Nos. PCT/US01/21005 and PCT/US03/08293, the disclosures of which are incorporated by reference herein in their entirety.

In one embodiment, the nanoimprint resist may comprise a photo-curable material, thermal-curable material, or the combination of both a photo-curable material and a thermal-curable material. When both a photo-curable material and a thermal-curable material are present in the nano-resist material, it is possible to first photocure and then, after imprinting, thermally cure. Or first thermally cure and then, after imprinting, photocure. These materials can be functional material which will be part of the devices that will not be removed in later processing. The second curing step may be carried out before or after removal of the mold from the film comprising the nanoimprint resist.

Suitable polymeric compositions deformable by said mold at a temperature of less than 200° C. can be formulated from a variety of polymers, oligomers, monomers, cross-linkers, graft-linkers, diluents, initiators, curing agents, and other additives known in the polymer art. Typically the polymeric compositions will be relatively soft at temperatures less than 200° C., such as by having a glass transition temperature less than 200° C. or being in a liquid state at a temperature less than 200° C. Polymeric compositions that have a liquid or soft state at use temperatures of the nanoimprint resist may also be used. Such liquid or soft polymeric compositions will typically be subject to a hardening condition prior to their subsequent in nanoimprint lithography. Examples of suitable hardening conditions include chemical reactions, such as cross-linking reactions, graft-linking reactions, condensation reactions, acid-base reactions, polymerization, as well as any a combination thereof. Examples of suitable hardening conditions also include thermophysical reactions such as crystallization and ordering upon heating or cooling of the polymeric composition. Combinations of chemical and thermophysical reactions are also envisioned as providing suitable polymeric compositions deformable by said mold at a temperature of less than 200° C.

Suitable polymeric compositions used in various embodiments of the invention include homopolymers, copolymers, a random co-polymers, block co-polymers, graft co-polymers, telechelic polymers, star polymers, as well as dendrimers, e.g., the so-called "starburst" polymers, as well as any combination thereof. Suitable polymers typically include: poly($C_1$-$C_{20}$ alkyl acrylates) and poly($C_1$-$C_{20}$ alkyl methacrylates) (both of which are also referred together to as $C_1$-$C_{20}$ alkyl (meth)acrylates), typical examples being poly(methyl methacrylate), poly(octadecyl methacrylate), poly(methylacrylate), poly(n-butyl acrylate), poly(butyl methacrylate), poly(isobutyl methacrylate); copolymers including $C_1$-$C_{20}$ alkyl (meth)acrylate units, typical examples being poly(vinyl stearate)/poly(methyl methacrylate), poly(methylhexadecylsiloxane)/poly(m-ethyl methacrylate), poly(octadecyl methacrylate)/poly(methyl methacrylate), poly(butyl methacrylate-co-isobutylmethacrylate), poly(butyl methacrylate-co-methyl methacrylate); polycarbonates, such as poly(bisphenol-A carbonate); polysiloxanes such as poly(methylhexadecylsiloxane); various vinyl polymers such as poly(vinylacetate), poly(vinyl stearate), and polyvinyl ethers; various alkyl oxide polymers such as poly(ethylene oxide) and poly(propylene oxide); polycaprolactone; styrenic polymers such as poly(styrene), poly(.alpha.-methylstyrene), as well as styreneic-containing copolymers such as poly(dimethylsiloxane-co-α-methylstyrene); graft-co-polymers such as poly(ethylene-covinylacate-)-graft(t-maleic anhydride); halide containing polymers and copolymers such as poly(vinyl chloride), poly(vinylidene fluoride), poly(chlorotrifluoroethylene), poly(dichloroethylene), poly(vinyl chloride-co-vinylacetate), poly(vinyl chloride-co-isobutylvinylether), poly(chlorotrifluorethylene-co-vinylidene fluoride); and any blend, graft, or block of a combination of one or more polymers.

Suitable polymeric compositions also can include thermoset resins. Many thermoset resins that can be used in the present invention include: alkyd resins, allyl diglycol carbonate resins, diallyl isophthalate resins, diallyl phthalate resins, melamine resins, melamine/phenolic resins, phenolic resins; unsaturated polyester resins, vinyl ester resins, acrylic systems, thiol-ene systems, vinyl ether systems; epoxy resins; unsaturated polyester resins; cyanoacrylate resins; melamine-formaldehyde resins; polyurethane resins; polyimide resins; polyphenol resins; and combinations thereof.

Suitable polymeric compositions may also include one or more oligomers. As used herein, the term "oligomer" refers to a compound comprised of from two to about 200 monomeric units, all of which can be the same or different. Suitable oligomers include those having reactive functionalities as well as non-reactive functionalities. Examples of suitable reactive and non-reactive oligomers composed of up to five monomeric units of $C_1$-$C_{20}$ alkyl (meth)acrylates are provided in U.S. Pat. No. 6,306,546, the disclosure of which is incorporated by reference herein in its entirety. Other suitable oligomers include reactive polysiloxane oligomers, reactive or any combination thereof.

Suitable polymers and oligomers can also include the so-called "liquid rubbers" ("LR"), which are widely used in thermosetting materials. Suitable LRs are composed of flexible polymer chains that have at least one non-functional aromatic terminal end-group. While polymer chain flexibility is provided by a glass transition temperature ($T_g$) less than about 25° C., it is often typical that the $T_g$ will be less than 10° C., more typically less than 0° C., even more typically less than −20° C., and further typically less than −40° C. Suitable LRs typically have low viscosities in uncured liquid resin formulations. Suitable LRs also tend to be miscible in uncured liquid resin formulations, however immiscible formulations can also be used. In certain embodiments, the LRs may phase separate upon curing (crosslinking) when provided with thermoset resins in the polymeric composition. Such phase separation typically forms rubbery microdomains in the polymeric matrix of the thermosetting resin. In other embodiments, however, it is desirable that such phase separation is minimized or avoided. Various types of LRs are disclosed in R. Mulhaupt, "Flexibility or Toughness?-The Design of Thermoset Toughening Agents", CHIMA 44, 43-52 (1990). Examples of liquid rubbers that are composed of flexible polymer chains that have at least one non-functional aromatic terminal end-group are also described in LaFleur, EPO Application No. 1 270 618.

In certain embodiments, the polymers and oligomers may contain functional groups. In these embodiments, the functional groups can be located anywhere on the molecule, including at their ends, denoted "terminally functional" or "functionally terminated". The functional groups can be at lease one of the following types: hydroxyl, phenolic, chlorobenzyl, bromobenzyl, mercapto (thiol), sulfide, amino, carboxylic acid, carboxylic esters, carboxyl halide, carboxylic amide, anhydride, aldehyde, epoxy, isocyanate, isothiocyanate, cyanate, alkoxysilane, silanol, vinyl, styryl, olefinic, dienes, allyl, acrylic, methacrylic, maleic, alkynyl, benzocyclo butene (BCB), and perfluorocyclobutyl (PFCB).

Commercially available functionally terminated LRs include carboxy-terminated copolymers of butadiene and acrylonitrile monomers, known as "CTBN" resins, and amino-terminated copolymers of butadiene and acrylonitrile monomers, known as "ATBN" resins. Similar copolymers end-functionalized with vinyl groups and epoxy groups are also known as "VTBN" and "ETBN", respectively. A particular useful composition includes an epoxy resin blended with one or more oligomers.

Suitable imprintable compositions of the present invention may also include one or more functional materials. These functional materials include, but not limited to: 1) low-dielectric silicon-containing materials: sol-gels from silicates, sol-gels from alkoxysilanes, acrylic-, methacrylic-, vinyl-, and epoxy-functionalized alkoxysilanes; HSQ (Hydrogen Silsesquioxane; MSQ (methyl silsesquioxane); and other reactive group-functionalized silsesquioxanes and oligomeric silsesquioxanes (hydroxyl, phenolic, chlorobenzyl, bromobenzyl, mercapto (thiol), sulfide, amino, carboxylic acid, carboxylic esters, carboxyl halide, carboxylic amide, anhydride, aldehyde, epoxy, isocyanate, isothiocyanate, cyanate, alkoxysilane, silanol, vinyl, styryl, olefinic, dienes, allyl, acrylic, methacrylic, maleic, alkynyl, benzo-cyclo butene (BCB), and perfluorocyclobutyl (PFCB)). 2) Low-dielectic organic polymeric materials including polyolefines, aromatic polyesters, aromatic polyimides, fluoropolymers, aromatic hydrocarbon oligomers, etc. 3) Nano-porogens may be used in the low-dielectric imprinting compositions. These include diblock polymer micelles, hyperbranched polymers/dendrimers, polymer nanoparticles, cage supermolecules, and high boiling point molecules. 4) Nanoparticles may be used in imprintable functional material compositions, including Au, Ag, Cu, Si, and other metal nanoparticles; $SiO_2$, $TiO_2$, and other inorganic nanoparticles; Polymeric nanoparticles. 5) Conductive polymers including thermoplastic moldable polymers; crosslinkable polymeric compositions with inherent conductive chain segments; conductive nanoparticles including metals, carbon blacks, graphites, fullerenes, and carbon nanotubes.

The viscosities of the imprintable functional material compositions in the present invention are in the range of 1 cent-poise to 1000,000 poise, preferably in the range of 1 cent-poise to 5000 cent-poise, at imprinting temperatures. The materials form stable structures after imprinting and removal of the mold.

In related embodiments of the invention, there are provided methods of forming a plurality of structures having at least one dimension less than 200 nm, which includes the step of imprinting a nanoimprint resist using a mold, the nanoimprint resist having a polymeric composition deformable by the mold at a temperature of less than 200° C. In these embodiments, the polymeric compositions are capable of retaining a plurality of structures upon removal of the mold.

In these and other embodiments, the polymeric compositions are deformable by the mold, typically at a temperature of less than 200° C., more typically at a temperature of less than about 150° C., and even more typically at a temperature of less than about 100° C. Suitable polymeric compositions typically include a photocurable polymeric composition, a thermoplastic polymeric composition, a thermosettable polymeric composition, or any combination thereof.

As used herein, the term "photocurable" refers to compositions in which a chemical reaction is brought about upon the application of a photon, such as light, e.g., ultraviolet ("UV") light and/or visible light. Suitable photocurable compositions typically include at least one monomer and one photocuring agent. Any one monomer, or combination of monomers, as herein described may be suitably used. Suitable photocuring agents include polymerization initiators, cross-linkers and graft-linkers that are activated by radiation, typically ultraviolet light. Suitable photocurable polymeric compositions will typically cure upon the exposure of radiation within the range of about 1 millisecond to about 2 seconds, although curing times are envisioned as capable of being outside this range. Suitable photocurable polymeric and monomeric compositions have viscosities in the range of 1 centipoise (cps) to 100,000 cps at the curing temperature, although viscosities are envisioned as capable of being outside this range.

If the resist material is to be applied on substrate by forming thin films from a resist solution, using methods such spin-coating, spray-drying, or dipping, the viscosity of the dry resist material (without any solvent) is in the range of 20 cps to 100,000 cps, preferably in the range of 50 cps to 500 cps, at the imprinting temperature. If the resist material is to be applied on substrate by forming discrete droplets on it, it viscosity at the imprinting temperature is in the range of 1 cps to 50 cps, preferably in the range of 1 cps to 10 cps.

In one embodiment, the polymeric composition includes about 10 weight percent to 50 weight percent of an monofunctional acrylic monomer, such as isobornyl methacrylate; about 5 to 40 weight percent of difunctional acrylic monomer, such as polyethyleneglycol (400) diacrylate; from about 5 to 70 weight percent of an oligomer, such as CN-2253 (a tetrafunctional polyester acrylate oligomer, from Sartomer); from about 5 to 50 weight percent of a trifunctional acrylic monomer, such as PHOTOMER® 4094 (propoxylated(4) glycerol triacrylate, from Cognis); and 1 to 10 weight percent of a photoinitiator, such as IRGACURE® 184 (1-hydroxy-cyclohexyl-phenyl-ketone, from Ciba Specialty Chemicals). In this embodiment, the monomers typically act like a solvent for dissolving all of the components. Typically, the composition has a viscosity of about 300 cps at 25° C., and can be spin-coated from a 5-10% solution in a suitable solvent, such as propyleneglycol methyl ether acetate (PMA), on a silicon wafer to form uniform thin nanoimprint resist film, The resist film can be imprinted by a nanomold, and photocured with a mercury UV lamp in about 2 seconds.

In another embodiment, the resist composition includes about 10 weight percent to 50 weight percent of an monofunctional acrylic monomer, such as isobutyl methacrylate; about 5 to 40 weight percent of a difunctional acrylic monomer, such as SR-212 (1,3-butylene glycol diacrylate, from Sartomer); from about 5 to 50 weight percent of a trifunctional acrylic monomer, such as PHOTOMER® 4094 (propoxylated(4) glycerol triacrylate, from Cognis Corporation); and 1 to 10 weight percent of a photoinitiator, such as IRGACURE® 184. Typically, the composition has a viscosity of smaller than 5 cps at 25° C., and can be dispensed on a silicon wafer as discrete resist droplets. The distributed resist liquid can be imprinted by a nanomold, and photocured with a mercury UV lamp in about 2 seconds.

Suitable thermoplastic polymeric compositions typically include any of the polymers described hereinabove. Suitable thermoplastic polymers typically having a glass transition temperature less than 100° C. Suitable thermoplastic polymers typically have a weight average molecular weight in the range of about 5,000 g/mol and 1,000,000 g/mole, although suitable thermoplastic polymers may have weight average molecular weights outside of this range. Examples of suitable thermoplastic polymers typically include any of the non-crosslinked or lightly crosslinked polymers described herein.

In other embodiments, there are provided thin films having a nanoimprint resist including a polymeric composition deformable by a mold at a temperature of less than 200° C., the mold being capable of forming a plurality of structures having at least one dimension less than 200 nm. In this aspect of the invention, the polymeric composition is capable of retaining the plurality of structures upon removal of the mold.

In other embodiments, there are provided nanoimprint resists including a polymeric composition deformable by a mold at a temperature of less than 200° C., the mold being capable of forming a plurality of structures having at least one dimension less than 200 nm. In this aspect of the invention, the polymeric composition is capable of retaining the plurality of structures upon removal of the mold.

In one embodiment, the invention provides nanoimprint resist compositions and thin films for use in nanoimprinting lithography to form patterns on a substrate. The compositions of the present invention permit formation of thin-film patterns in the form of nanoscale features, such as holes, pillars, or trenches. These nanoscale features typically have a minimum size of about 25 nm, a depth over about 100 nm, a side wall smoothness better than about 3 nm, and corners with near perfect 90 degrees angles. The compositions of the present invention can be used in nanoimprint processes to form sub-10 nm structures having a high aspect ratio.

One embodiment includes a material deposition and a lift-off process for fabricating 100 nm wide metal lines of a 200 nm period and 25 nm diameter metal dots of 125 nm period. The resist pattern that can be created using the present invention can also be used as a mask to etch nanostructures (features having dimensions less than 1000 nm, preferably less than 500 nm) into a substrate. The compositions also permit manufacture of larger film surface areas, while still retaining high resolution and lowered waste due to damage of the film when removed from the nanomold. The present invention can also is capable of improving the nanoimprint process to even larger area mold (over 6 inch) with high quality.

In another embodiment of the present invention the imprintable functional material composition includes about 10 weight percent to 50 weight percent of a siloxane monomer, SIB1400.0 (from Gelest, Inc); about 10 weight percent to 50 weight percent of a functionalized silsesquioxane monomer, SIM6486.6 (feom Gelest, Inc.); about 10 weight percent to 45 percent of a functionalized alkoxysilane, methacryloxypropyltrimethoxysilane; about 5 weight percent to 40 percent of crosslinkers, such as TMPTMA and divinylbenzene; and about 2 weight percent to 10 weight percent of a combination of initiators, such as Irgacure 184, Irgacure 819, and dicumyl peroxide. The imprintable composition has a modest viscosity at room temperature and can be imprinted and UV-cured well in a nanomold. The imprinted structures are subsequently thermally baked at 450° C. to give low dielectric material nano-structures.

In certain embodiments, the nanoresist compositions present include: (A) one or more materials from the group of polymers, oligomers, and monomer mix. Optionally, the compositions may further comprise other additives as needed, such as one or more of (B) one or more plasticizers; (C) one or more internal mold release agents; and (D) other additives, such as compatibilizers, lubricants, and stabilizers.

In other embodiments, a variety of nanoimprint resist compositions are provided by the present invention for a variety of nanoimprint process schemes. For example, for a thermal imprint, where the temperature is used to control the viscosity and flowability of moldable materials, a photoinitiator is typically not required, although a combination of thermal and photoinitiator can be used, for example photo-initiator, thermal initiator, or both, can be used for post-imprint UV exposure or bake for improving mechanical strength. In these embodiments, crosslinking agents can also be added to crosslink the nanoimprint resist compositions.

In various nanoimprint processes, it is also possible for one to use either a single layer nanoimprint composite or multi-layers of composites in the present inventions. In the multi-layer embodiments, the layer properties can be the same or different than each other. For example, patterns created at the top layer can be transferred to the underlayers by etching or other conventional techniques of pattern transfer known in the art of chemical microelectronics lithography.

Component Group A: One or More Materials From the Group of Polymers, Oligomers, and Monomer Mix This category includes different polymers with the structures of homopolymers or co-polymers, which can be random, block, alternative, grafted, telechelic, star, dendrimer, e.g., hyperbranched polymers and oligomers; polymers having different molecular weights; oligomers; different monomers; the mix from polymers, oligomers, and monomers; non-reactive system; reactive system (the materials become hard or non-flowable during or after the process by UV, thermal and other treatments); polymer blends (of the above systems); materials that are resistive to reactive ion etching; moldable polymers and reactive oligomers (monomers); as well as any combinations thereof.

Examples of polymers having a different main chain backbone, suitable for use in compositions, include, but are not limited to, poly(methyl methacrylate) (PMMA), poly(bisphenol-A carbonate), and poly(methylhexadecylsiloxane).

Examples of suitable polymers having different side chains suitable for use in the invention include, but are not limited to, PMMA, poly(methylacrylate), poly(n-butyl acrylate), poly(octadecyl methacrylate), poly(isobutyl methacrylate), and poly(butyl methacrylate)

Typically, suitable polymeric components will typically have a weight average molecular weight in the range of from about 1,000 g/mol to about 1,000,000 g/mol, typically in the range of from about 5,000 g/mol to about 200,000 g/mol. More typically in the range of from about 10,000 g/mol to about 100,000 g/mol, and even more typically in the range of from about 20,000 g/mol to about 50,000 g/mol. Examples of polymers having different weight average molecular weights suitable for use in the invention include, but are not limited to, poly(vinylacetate 110,000 g/mol) and poly(vinylacetate 650,000 g/mol).

A variety of polymer morphologies are also suitable for use in the present invention, for example, crystalline, semi-crystalline, amorphous, glassy, as well as containing microphase separated regions that are commonly found in ordered block and graft copolymers. Examples of polymers having different morphologies suitable for use in the invention include, but are not limited to, poly(vinyl stearate) (PVS), poly(ethylene oxide), polycaprolactone, and poly(α-methylstyrene). Advanced polymeric architectures (such as graft copolymers, block copolymers, comb polymers, star polymers, starburst polymers, etc.) each having two or more polymer chains or chain fragments are also envisioned. In the case of advanced polymeric architectures such as these, it is typical that up to all of the chain ends can contain non-functional aromatic end-groups.

Examples of suitable polymer blends suitable for use in the invention include, but are not limited to, PVS/PMMA; poly(methylhexadecylsiloxane)/PMMA; and poly(octadecyl methacrylate)/PMMA.

Examples of suitable random co-polymers suitable for use in the invention include, but are not limited to, poly(butyl methacrylate-co-isobutylmethacrylate); poly(butyl methacrylate-co-methyl methacrylate); poly(dimethylsiloxane-co-α-methylstyrene); copolymers of isobornyl (meth)acrylate; copolymers of isobutyl methacrylate; poly(ethylene-co-vinylacate)-graft(t-maleic anhydride); poly(vinyl chloride-co-vinylacetate); poly(vinyl chloride-co-isobutylvinylether); and poly(chlorotrifluoroethylene-co-vinyldiene fluoride).

Monomers suitable for use in the present invention include "High-$T_g$" as well as "Low-$T_g$" monomers. Low-$T_g$ monomers are typically selected from the following group: $C_1$ to $C_{20}$ alkyl acrylate monomers such as butyl acrylate, ethyl acrylate, n-octyl acrylate, and 2-ethylhexyl acrylate; diene monomers such as butadiene and isoprene; siloxane monomers such as dimethylsiloxane, vinyl acetate monomers; vinyl ether monomers, dithiol, trithiol, and multiple thiol monomers, and copolymers thereof. Examples of high-$T_g$ monomers typically include $C_1$ to $C_8$ alkyl methacrylates, isobornyl methacrylate, styreneics, acrylonitrile, epoxies and imides.

In certain embodiments, it is desirable that the weight fraction of the low-$T_g$ monomers in the polymeric compositions be selected so that the nanoimprinting layer is not too soft. Accordingly, in instances where harder nanoimprinting layers are sought, it is desirable that the weight fraction of the $C_1$ to $C_{20}$ alkyl acrylate monomers typically comprise no more than 50, more typically no more than 40, even more typically no more than 30, and most typically no more than 20 weight percent of the polymerized polymeric composition.

Various co-monomers that may also be incorporated in the polymeric compositions of the present inventions, include one or more ethylenically unsaturated monomers from one or more of the following monomer classes: (meth)acrylic acids; (meth)acrylonitriles; (meth)acrylamides; 2-(perfluoroalkyl) ethyl (meth)acrylates; 2-(perhaloalkyl)ethyl (meth)acrylates; $C_1$-$C_{20}$ alkyl (meth)acrylates; alkyl(ethyleneoxy)$_n$(meth) acrylates; amino (meth)acrylates; aryl (meth)acrylates including multiple rings and substituted rings; conjugated dienes; silanes; siloxanes; vinyl aromatics, including multiple rings and substituted rings; vinyl benzoic acids; vinyl ester; vinyl ethers; vinyl halides; vinyl phosphoric acids; vinyl sulfonic acids; vinylic anhydrides; vinylidene halides; fluorophenyl (meth)acrylates; vinyltrimethylsilanes; and any combination thereof.

Co-monomers are typically selected from mono-functional monomers such as: vinyl aromatic (e.g., styrene and methyl styrenes), alkyl acrylates and alkyl methacrylates (e.g., methyl acrylate, methyl methacrylate, ethyl acrylate, ethyl methacrylate, etc.), and acrylonitrile monomers (acrylonitrile and methyl acrylonitrile). These co-monomers help to adjust the solubility of the liquid rubber in the uncured liquid thermoset resins. In certain embodiments of the present invention, suitable monomers and oligomers include, lauryl methacrylate; epoxy resin; acrylic (methylacrylic) oligomers; reactive polysiloxane oligomers; fluorinated acrylate/ methacrylate; and trimethylolpropane triacylate/methacrylate/tri/tetra-allylether.

Other Additives

The compositions can include other suitable additives including, but not limited to, plasticizers, internal release agent, lubricants, antioxidants, processing aids, UV stabilizers, anti-static agents, flame retardants etc. One of skill in the art can readily select these materials and their amounts based on the properties desired. The materials, if solid, are typically of dimensions that do not interfere with the ability of the polymeric material or the polymerizable liquid to flow into the mold cavities.

Component Group B: Plasticizers

As used herein, the term "plasticizer" refers to a compound capable of reducing the $T_g$ of polymeric composition when blended therewith. Examples of suitable plasticizers suitable for use in the invention include, but are not limited to, adipic acid derivatives, such as diisodecyl adipate and dinonyl adipate; azelaic acid derivatives, such as diisotyl azeleate and di-n-hexyl azelate; benzoic acid derivatives, such as diethylene glycol dibenzoate and polyethylene glycol 200 dibenzoate; epoxy derivatives, such as epoxidized soy bean oil; glycerol derivatives such as glycerol triacetate; isophthalic acid derivatives, such as dimethyl isophthalate; myristic acid derivatives, such as isopropyl myristate; oleic acid derivatives, such as propyleoleate and tetrahydrofurfuryloleate; paraffin derivatives, such as chloroparaffin; phosphoric acid derivatives, such as triphenyl phosphate; phthalic acid derivatives, such as diisooctyl phthalate and diisodevyl phthalate; ricinoleic acid derivatives, such as propylene glycol ricinoleate; sebacic acid derivates, such as dibutyl sebacate; stearic acid derivatives, such as butyl stearate and propylene glycol monostearate; succinic acid derivatives, such as diethyl succinate; and sulfonic acid derivatives, such as ortho- and para-toluenesulfonamide.

Component Group C: Internal Release Agents

As used herein, the term "internal release agent", which is synonymous with "internal mold release agent" used herein, refers to a compound, which when blended in a polymeric composition, is capable of reducing adhesion of the polymeric composition to a surface. While not wishing to be bound to a particular theory of operation, it is believed that the internal release agents of the present invention migrate to the interface between the nanoimprint mold and the nanoimprint resist, thereby reducing the energy of adhesion of the nanoimprint resist composition for the nanoimprint mold surface. Examples of suitable internal mold release agents suitable for use in the invention include but are not limited to polysiloxane and perfluorinated surfactants; polysiloxane-containing polyether or polyesters; perfluorinated (methyl)acrylates; reactive and non reactive backbones; fluorinated agents, such as ZONYL® FSE (Dupont), ZONYL® FS-62 (Dupont), FC-170-C (3M), and FC-95 (3M); siloxane based agents, such as GP-187, GP-277, GP-287 (Innovative Polymer Technology), and 55-NC (Dexter); siloxane containing polymers, as well as combinations thereof.

Component Group D: Compatibilizers, Lubricants, and Stabilizers

Other additives suitable for use in the invention, include, but are not limited to reactive ion etching ("RIE") resistance, antistatic agents, stabilizers, compatibilizers, flame retardants, and lubricants. These additional additives can be included in the compositions for improving other properties of the resists.

Initiators

Examples of initiators suitable for use in compositions include, but are not limited to, thermal initiators, such as benzyl peroxide (BPO) and azobisisobutyronitrile (AIBN); UV and other radiation initiators, such as substituted and unsubstituted polynuclear quinones, benzophenone, 1-hydroxydhexyl phenyl ketone, 2-hydroxy-2-methyl-1-phenyl-1-propanone, 2,2-dimethoxy-2-phenyl-acetophenone (benzildimethyl ketal, BDK), 2-methyl-1-[4-(methylthio) phenyl]-2-morpholinopropanone-1,2,4,6-trimethylbenzolyl-diphenylphosphine oxide (IRGACURE® 819), and combinations thereof, as well as any other chemical substance or combination of substances that can generate free radicals, cations, anions and any other reactive species that can initiate polymerizations or crosslinking reactions. Free radical initiators are described, for example, in B. M. Monroe and G. C. Weed, CHEM. REV., 93, 435-448 (1993).

Many suitable polymeric compositions useful in the invention are composed of at least one of each of the components described above in Component Groups A, B, C and D. In certain embodiments of the present invention, the nanoimprint resists include from about 20 weight percent to 100 weight percent of the polymeric composition, up to about 80 weight percent of a plasticizer, and up to about 30 weight percent of a mold release agent. In other embodiments, the nanoimprint resists include from about 1 weight percent to about 50 weight percent of an oligomer; from about 0.01 weight percent to about 10 weight percent of a crosslinking agent; from about 50 weight percent to about 90 weight percent of a monomer; and from about 0.01 weight percent to about 2 weight percent of a photoinitiator. In certain of these embodiments, the polymeric compositions are capable of providing sub-50 nanometer structures in the nanoimprint resists. Desirably, the polymeric materials in these embodiments are below their glass transition temperature upon removal of the mold during the nanoimprinting process.

In certain embodiments, there are provided thin films that include a nanoimprint resist comprising a polymeric composition deformable by a mold at a temperature of less than 200° C., said mold being capable of forming a plurality of structures having at least one dimension less than 200 nm, said polymeric composition being capable of retaining said plurality of structures upon removal of said mold. In certain of these embodiments, the nanoimprint resist further include a plasticizer, a mold release agent, a monomer, a crosslinker, an additive, or any combination thereof. In particular, there are provided several embodiments where the thin films are composed of nanoimprint resists that include from about 20 weight percent to 100 weight percent of the polymeric composition, up to about 80 weight percent of a plasticizer, and up to about 30 weight percent of a mold release agent.

In another embodiment of the present invention, the polymeric composition includes from about 1 weight percent to about 50 weight percent of units derived from an oligomer; from about 0.01 weight percent to about 10 weight percent of units derived from a crosslinking agent; and from about 50 weight percent to about 90 weight percent of units derived from a monomer. Typically, these polymeric compositions are deformable at a temperature of less than about 100° C., and typically deformable at a temperature above about 10° C. Accordingly, in certain embodiments, suitable thermoplastic compositions can provide nanoimprint resist having a glass transition temperature below about 10° C. In these embodiments, the polymeric composition typically includes at least one of a photocurable polymeric composition, a thermoplastic polymeric composition, a thermosettable polymeric composition, or any combination thereof.

In another embodiment, there is provided a nanoimprint resist, which includes a polymeric composition deformable by a mold at a temperature of less than 200° C., the mold capable of forming a plurality of structures having at least one dimension less than 200 nm, the polymeric composition capable of retaining said plurality of structures upon removal of said mold. In this embodiment, the nanoimprint resists is provided by any of the polymeric compositions provided herein.

All ranges described herein are inclusive and combinable.

The advantageous properties of this invention can be observed by reference to the following examples, which illustrate but do not limit the invention.

EXAMPLES

Examples 1-10 disclose various compositions that are useful in the invention. The compositions can be prepared according to well known methods in the art.

Example 1

A polymeric composition is composed of the following components.

| component | weight percent |
| --- | --- |
| poly(butyl methacrylate) | 20%-99.9% |
| dioctyl phthalate | 0-79.9% |
| GP-277 | 0.1-30% |

Example 2

A polymeric composition is composed of the following components.

| component | weight percent |
| --- | --- |
| poly(methylhexadecylsiloxane) | 50%-100% |
| polyethylene glycol 200 dibenzoate | 0-50% |

Example 3

A polymeric composition is composed of the following components.

| component | weight percent |
| --- | --- |
| polystyrene | 20%-99.9% |
| diisodecyl adipate | 0%-79.9% |
| GP-187 | 0.01%-30% |

Example 4

A polymeric composition is composed of the following components.

| component | weight percent |
| --- | --- |
| poly(octadecyl methacrylate) | 90-99% |
| triphenyl phosphate | 0%-10% |
| FS-62 | 0%-1% |

Example 5

A polymeric composition is composed of the following components.

| component | weight percent |
| --- | --- |
| poly(vinylchloride-co-vinylacetate) | 20%-100% |
| diisodevyl phthalate | 0%-80% |
| GP-187 | 0%-30% |

Example 6

A composition of the invention comprises the following components.

| component | weight percent |
| --- | --- |
| polyvinylacetate | 20%-100% |
| diisodevyl phthalate | 0%-80% |
| siloxane containing polymer | 0%-30% |

Example 7

A composition of the invention comprises the following components.

| component | weight percent |
| --- | --- |
| Divinylbenzene (DVB) | 28% |
| polyvinylacetate (PVAc) | 68% |
| GP-187 | 2% |
| AIBN | 2% |

Example 8

A composition of the invention comprises the following components.

| component | weight percent |
| --- | --- |
| Acrylic polysiloxane | 73% |
| TMPTA (trimethylolpropane triacrylate) | 11% |
| Lauryl methylacrylate | 12% |
| IRGACURE ® 184 | 4% |

Example 9

A composition of the invention comprises the following components.

| component | weight percent |
| --- | --- |
| Isobornyl methacrylate | 20% |
| Polyethyleneglycol(400) diacrylate | 10% |
| CN-2253 | 41% |
| PHOTOMER ® 4094 | 25% |
| IRGACURE ® 184 | 4% |

Example 10

A composition of the invention comprises the following components.

| component | weight percent |
| --- | --- |
| Isobutyl methaacrylate | 40% |
| SR-212 | 30% |
| PHOTOMER ® 4094 | 25% |
| IRGACURE ® 184 | 5% |

Example 11

An imprintable functional material composition of the invention comprises the following components.

| component | weight percent |
| --- | --- |
| SIB1400.0 | 27% |
| SIM6486.6 | 30% |
| Methacryloxypropyl trimethoxysilane | 16% |
| TMPTMA | 10% |
| Divinyl benzene | 10% |
| IRGACURE ® 184 | 3% |
| IRGACURE ® 819 | 1% |
| Dicunyl peroxide | 3% |

Having described the invention, we now claim the following and their equivalents.

What is claimed is:

1. A method for forming a pattern in a film carried on a substrate, said method comprising:

obtaining a mold of a material, which mold is hard relative to the film, the film comprising a polymeric composition deformable by said mold;

the mold having first and second nanoscale protruding features spaced apart from each other and a recess formed thereby, the first and second features and the recess having a shape forming a mold pattern and providing at least one mold pattern lateral dimension which is less than 200 nm;

urging the mold into the film under a molding pressure, whereby the thickness of the film under the protruding features of the mold are reduced, thereby forming the mold pattern in the film;

solidifying the mold-deformed film;

removing the mold from the film; and removing from the film the nanoscale areas of reduced thickness, thereby exposing portions of the surface of the substrate which underlie the nanoscale areas of reduced thickness such that the exposed portions of the surface of the substrate substantially replicate the mold pattern and have at least one lateral dimension which is less than 200 nm.

2. The method of claim 1, wherein the polymeric composition comprises a copolymer, a random polymer, a block polymer, a grafted polymer, a telechelic polymer, a star polymer, a dendrimer, or any combination thereof, wherein said copolymer, said random polymer, said block polymer, said grafted polymer, said telechelic polymer, said star polymer, or said dendrimer may be a reactive polymer.

3. The method of claim 1, wherein the polymeric composition comprises:

poly(methyl methacrylate), poly(bisphenol-A carbonate), poly(methylhexadecylsiloxane), poly(methylacrylate), poly(n-butyl acrylate), poly(octadecyl methacrylate), poly(isobutyl methacrylate), poly(butyl methacrylate), poly(vinylacetate), poly(vinyl stearate), poly(ethylene oxide), polycaprolactone, poly(.alpha.-methylstyrene), poly(vinyl stearate)/poly(methyl methacrylate), poly(methylhexadecylsiloxane)/ poly(methyl methacrylate), poly(octadecyl methacrylate)/poly(methyl methacrylate), poly(butyl methacrylate-co-isobutylmethacrylate), poly(butyl methacrylate-co-methyl methacrylate), poly(dimethylsiloxane-co-alpha-methylstyrene), poly(ethylene-co-vinylacate)-graft(t-maleic anhydride), poly(vinyl chloride-co-vinylacetate), poly(vinyl chloride-co-isobutylvinylether), poly(chlorotrifluorethylene-co-vinyldiene fluoride), amide-containing polymers, imide-containing polymers, urethane-containing polymers, or any combination thereof.

4. The method of claim 1, wherein the polymeric composition comprises an oligomer, said oligomer comprising an epoxy resin, an acrylic (methylacrylic) oligomer, a vinyl ether oligomer, a reactive polysiloxane oligomer, or any combination thereof.

5. The method of claim 1, wherein the polymeric composition further comprises a monomer, said monomer comprising a C8-C20 alkyl methacrylate, a fluorinated alkyl (meth) acrylate monomer, or any combination thereof.

6. The method of claim 1, wherein the polymeric composition further comprises a crosslinker, said crosslinker comprising DVB, TMPTA, di-epoxies, tri-epoxies, tetra-epoxies, di-vinyl ethers, tri-vinyl ethers, tetra-vinyl ethers, or any combination thereof.

7. A method of forming a plurality of nanoscale structures having at least one lateral dimension less than 200 nm, which comprises the steps of
  obtaining a substrate;
  depositing a nanoimprint resist on the substrate;
  obtaining a mold of a stiff material which is hard relative to the nanoimprint resist, the mold having a first nanoscale protruding feature and a recess formed thereby and a second nanoscale protruding feature spaced apart prom the first protruding feature, the first and second features and the recess having a shape forming a mold pattern;
  imprinting the deposited nanoimprint resist using the mold, said nanoimprint resist comprising a polymeric composition deformable by said mold, said polymeric composition capable of retaining said plurality of structures upon removal of said mold following said imprinting.

8. The method of claim 7, wherein said polymeric composition comprises a photocurable polymeric composition, a thermoplastic polymeric composition, a thermosettable polymeric composition, or any combination thereof.

9. The method of claim 8, wherein said photocurable polymeric composition is capable of curing in less than about 2 seconds.

10. The method of claim 8, wherein said photocurable polymeric composition has a viscosity of greater than about 2 poise at 25° C.

11. The method of claim 10, wherein said photocurable polymeric composition has a viscosity in the range of about 10 poise to about 30 poise.

12. The method of claim 8, wherein said photocurable polymeric composition comprises an oligomer, said oligomer comprising silicon atoms.

13. The method of claim 8, wherein said photocurable polymeric composition is capable of crosslinking in less than about 2 seconds.

14. The method of claim 8, wherein said photocurable polymeric composition comprises up to about 90 weight percent monomer.

15. The method of claim 7, wherein said nanoimprint resist further comprises a plasticizer, a mold release agent, a monomer, a reactive polymer, a crosslinker, an additive, or any combination thereof.

16. The method of claim 7, wherein said nanoimprint resist comprises from about 20 weight percent to 100 weight percent of said polymeric composition, up to about 80 weight percent of a plasticizer, and up to about 30 weight percent of a mold release agent, wherein a sum of weights of the polymeric composition, the plasticizer and the mold release agent is less than or equal to 100 percent.

17. The method of claim 7, wherein said nanoimprint resist comprises;
  a) from about 1 weight percent to about 50 weight percent of an oligomer;
  b) from about 1 weight percent to about 50 weight percent of a reactive polymer;
  c) from about 0.01 weight percent to about 10 weight percent of a crosslinking agent;
  d) from about 50 weight percent to about 90 weight percent of a monomer; and
  e) from about 0.01 weight percent to about 2 weight percent of an initiator,
  wherein a sum of the weights of the oligomer, the reactive polymer, the crosslinking agent, the monomer and the initiator is less than or equal to 100 percent.

18. The method of claim 7, wherein sub-50 nanometer structures are formed.

19. The method of claim 7, wherein said polymeric material is above its glass transition temperature upon removal of said mold.

* * * * *

UNITED STATES PATENT AND TRADEMARK OFFICE
CERTIFICATE OF CORRECTION

PATENT NO. : 8,603,386 B2  Page 1 of 1
APPLICATION NO. : 11/980918
DATED : December 10, 2013
INVENTOR(S) : Stephen Y. Chou et al.

It is certified that error appears in the above-identified patent and that said Letters Patent is hereby corrected as shown below:

In the Specification
Column 1, Line 21
After the section entitled "Cross-Reference to Related Applications" please add the following line as its own paragraph:

--This invention was made with government support under Grant No. N66001-98-1-8900 awarded by the Defense Advanced Research Project Agency (DARPA). The government has certain rights in the invention.--

Signed and Sealed this
Seventh Day of October, 2014

Michelle K. Lee
*Deputy Director of the United States Patent and Trademark Office*